(12) United States Patent
Froebel et al.

(10) Patent No.: US 7,656,505 B2
(45) Date of Patent: Feb. 2, 2010

(54) APPARATUS TO EASILY MEASURE RETICLE BLIND POSITIONING WITH AN EXPOSURE APPARATUS

(75) Inventors: Robert T. Froebel, Fairfax, VT (US); Grant N. Pealer, III, Jericho, VT (US); Paul D. Sonntag, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 510 days.

(21) Appl. No.: 11/326,968

(22) Filed: Jan. 6, 2006

(65) Prior Publication Data

US 2006/0114434 A1 Jun. 1, 2006

Related U.S. Application Data

(62) Division of application No. 10/064,920, filed on Aug. 29, 2002, now Pat. No. 7,005,221.

(51) Int. Cl.
G03B 27/72 (2006.01)
(52) U.S. Cl. .......................................... 355/71
(58) Field of Classification Search .................. 355/71, 355/75, 53, 67
See application file for complete search history.

(56) References Cited

U.S. PATENT DOCUMENTS

| 4,385,838 | A | | 5/1983 | Nakazawa et al. |
| 4,937,618 | A | | 6/1990 | Ayata et al. |
| 4,958,160 | A | | 9/1990 | Ito et al. |
| 5,133,603 | A | | 7/1992 | Suzuki et al. |
| 5,376,482 | A | | 12/1994 | Hwang et al. |
| 5,811,211 | A | | 9/1998 | Tanaka et al. |
| 5,830,610 | A | | 11/1998 | Leroux et al. |
| 6,040,583 | A | * | 3/2000 | Onoda ................... 250/492.22 |
| 6,151,122 | A | | 11/2000 | Taniguchi et al. |
| 6,169,602 | B1 | | 1/2001 | Taniguchi et al. |

OTHER PUBLICATIONS

Sheats et al. "Microlithography: science and technology." 1998. Marcel Dekker, Inc. pp. 1-3.*

* cited by examiner

Primary Examiner—Hung Henry Nguyen
Assistant Examiner—Chia-how Michael Liu
(74) Attorney, Agent, or Firm—Schmeiser, Olsen & Watts; Anthony J. Canale

(57) ABSTRACT

An exposure apparatus and printed wafer such that a design is printed within a peripheral portion of the wafer. The peripheral portion of the wafer is between an outer boundary of an active portion of the wafer and an outer boundary of the wafer. The exposure apparatus comprises a lens, a reticle that includes a pattern, and a reticle blind. The reticle blind blocks a first portion of light that is passed through the exposure apparatus. A transparent portion of the reticle transmits a remaining portion of the light. The lens focuses the remaining portion of the light onto the wafer such that an image of a portion of the pattern is printed as the design within the peripheral portion of the wafer. The printed design is a function of where the reticle blind is positioned relative to the pattern.

6 Claims, 8 Drawing Sheets

_US 7,656,505 B2_

APPARATUS TO EASILY MEASURE RETICLE BLIND POSITIONING WITH AN EXPOSURE APPARATUS

BACKGROUND OF THE INVENTION

This application is a divisional of Ser. No. 10/064,920, filed on Aug. 29, 2002 now U.S. Pat. No. 7,005,221.

1. Technical Field

The present invention relates to a method of printing a wafer and an associated exposure apparatus.

2. Related Art

In printing a wafer with integrated circuit chips using photolithographic processes, a reticle blind of an exposure apparatus blocks exposure light from reaching portions of the wafer so that the portions of the wafer can be selectively printed. If the reticle blinds are incorrectly positioned, however, the wafer will be incorrectly printed. Thus, there is a need for a method, exposure apparatus, and printed wafer that enables a determination of whether the reticle blind has been correctly positioned within the exposure apparatus.

SUMMARY OF THE INVENTION

In first embodiments, the present invention provides a method of printing a wafer, comprising printing a design within a peripheral portion of the wafer, wherein the peripheral portion of the wafer is between an outer boundary of the active portion of the wafer and an outer boundary of the wafer.

In second embodiments, the present invention provides an exposure apparatus for printing a wafer, comprising:

a lens;

a reticle that includes a pattern; and a reticle blind, wherein the reticle blind is adapted to block a first portion of light that is passed through the exposure apparatus, wherein a transparent portion of the reticle is adapted to transmit a remaining portion of the light, wherein the lens is adapted to focus the remaining portion of the light onto the wafer such that an image of a portion of the pattern is printed as a design within a peripheral portion of the wafer, wherein the peripheral portion of the wafer is between an outer boundary of the active portion of the wafer and an outer boundary of the wafer, and wherein the printed design is a function of where the reticle blind is positioned relative to the pattern.

In third embodiments, the present invention provides a printed wafer, comprising: a design printed within a peripheral portion of the wafer, wherein the peripheral portion of the wafer is between an outer boundary of the active portion of the wafer and an outer boundary of the wafer.

The present invention advantageously provides a method, exposure apparatus, and printed wafer that enables a determination of whether a reticle blind has been correctly positioned within the exposure apparatus used for printing the wafer.

DETAILED DESCRIPTION OF THE INVENTION

Figure 1:
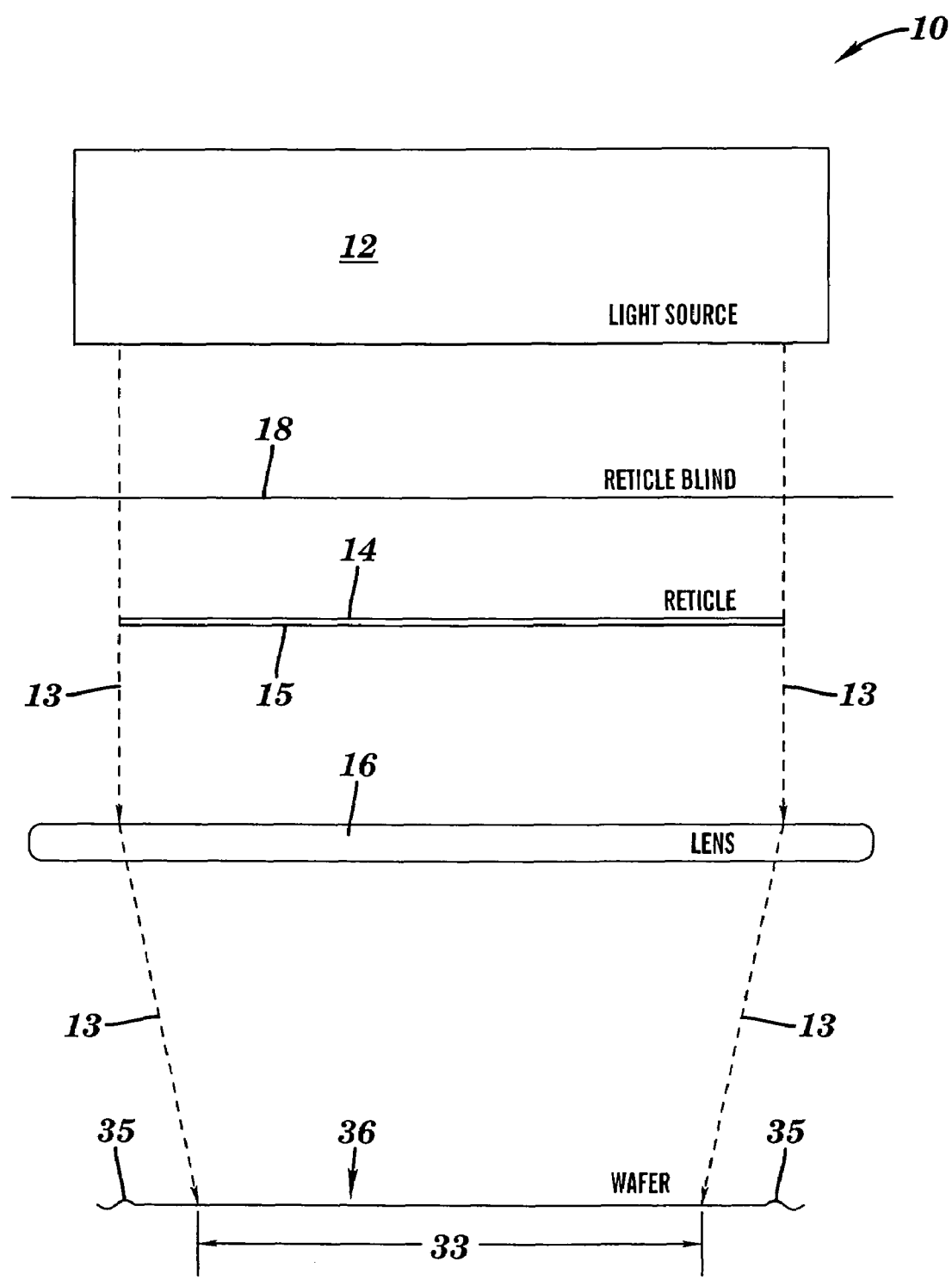
FIG. 1 depicts a front view of an exposure apparatus over a wafer, in accordance with embodiments of the present invention.
Figure 6:
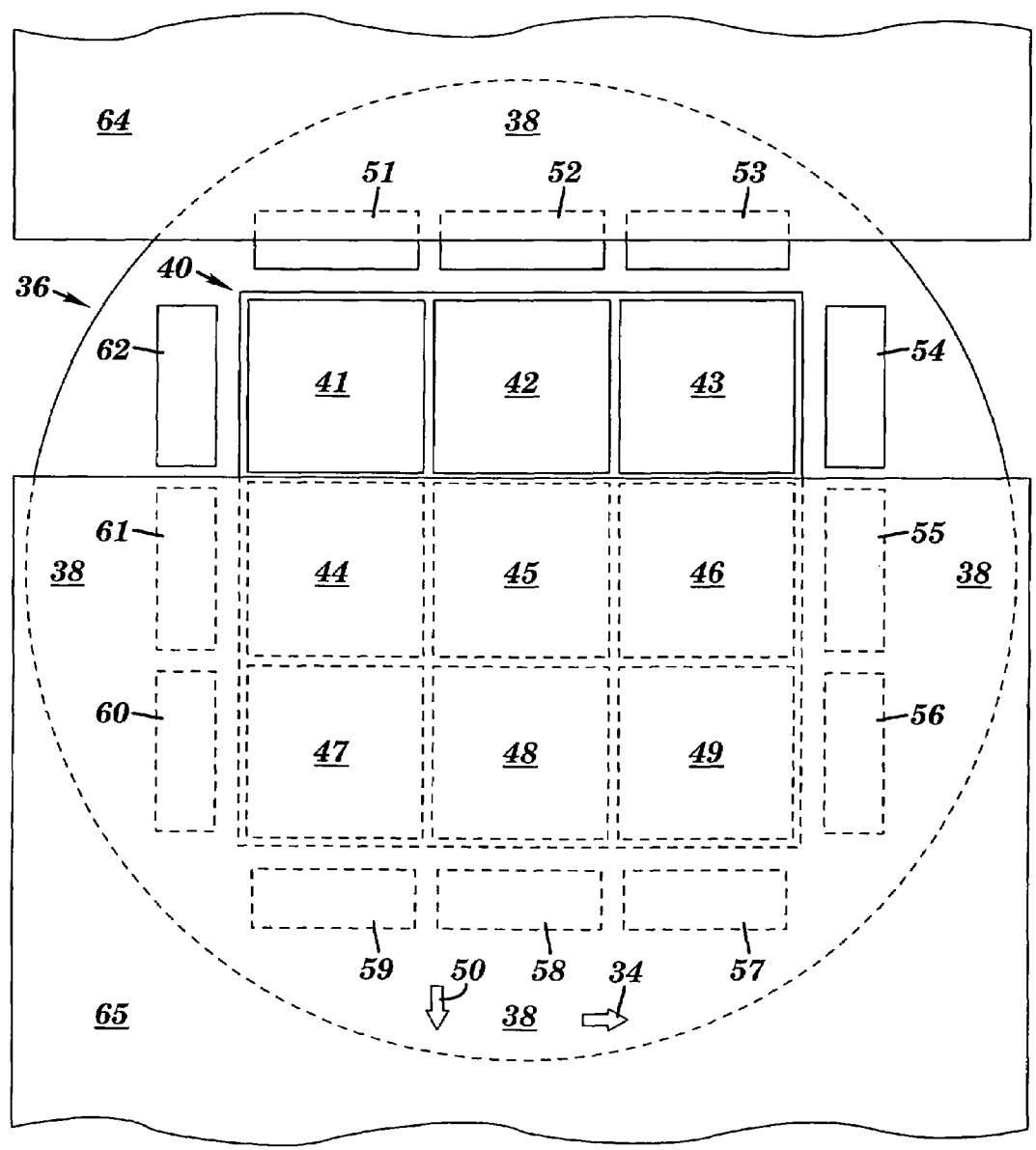
FIG. 6 depicts the wafer of FIG. 5 showing reticle blinds over the wafer, in accordance with embodiments of the present invention.

FIG. 1 depicts a front view of an exposure apparatus 10 over a wafer 36, in accordance with embodiments of the present invention. The exposure apparatus 10 comprises a light source 12, a reticle 14, a lens 16, and a reticle blind(s) 18. The light source 12 is any type of light source (e.g., an ultraviolet light source) that is known the art for printing a wafer. The reticle 14 may comprise, inter alia, a sheet of glass coated with chrome on a backside 15 of the reticle 14. The lens 16 focuses light 13 from the light source 12 onto the wafer 36. The wafer 36 comprises a device field 33 and a remaining portion 35. The device field 33 of the wafer 36 comprises electrical devices such as semiconductor devices (e.g., integrated circuit chips). The remaining portion 35 of the wafer 36 includes other device fields as well as peripheral space in a peripheral portion of the wafer 36. A more complete view of the wafer 36 may be found FIG. 4 which shows device fields 41-49 and the peripheral portion 38 of the wafer 36. The device field 33 of FIG. 1 represents any one of the device fields 41-49 of FIG. 4. Although the peripheral portion 38 of FIG. 4 includes wasted space, this peripheral portion 38 is beneficially used in the present invention, as will be explained infra. In FIG. 1, the reticle blind 18 represents one or more reticle blinds. As an example, four reticle blinds may be represented by reticle blind 18, wherein the four reticle blinds are (looking down on the wafer) an upper reticle blind, a lower reticle blind, a left reticle blind, and a right reticle blind, as explained more explicitly infra in conjunction with FIG. 6. Each individual reticle blind 18 is a thin opaque plate (e.g., a metallic plate) that selectively blocks the light 13 from being incident on portions of the wafer 36. This selective light-blocking functionality of the reticle blind 18 is not explicitly shown in FIG. 1, inasmuch as only an edge of the reticle blind 18 and the wafer 36 is shown in FIG. 1. FIG. 6 depicts upper and lower reticle blinds 64 and 65, respectively, over the wafer 36 in a top view and more clearly demonstrates the aforementioned selective light-blocking functionality of the reticle blind 18.

Figure 2:
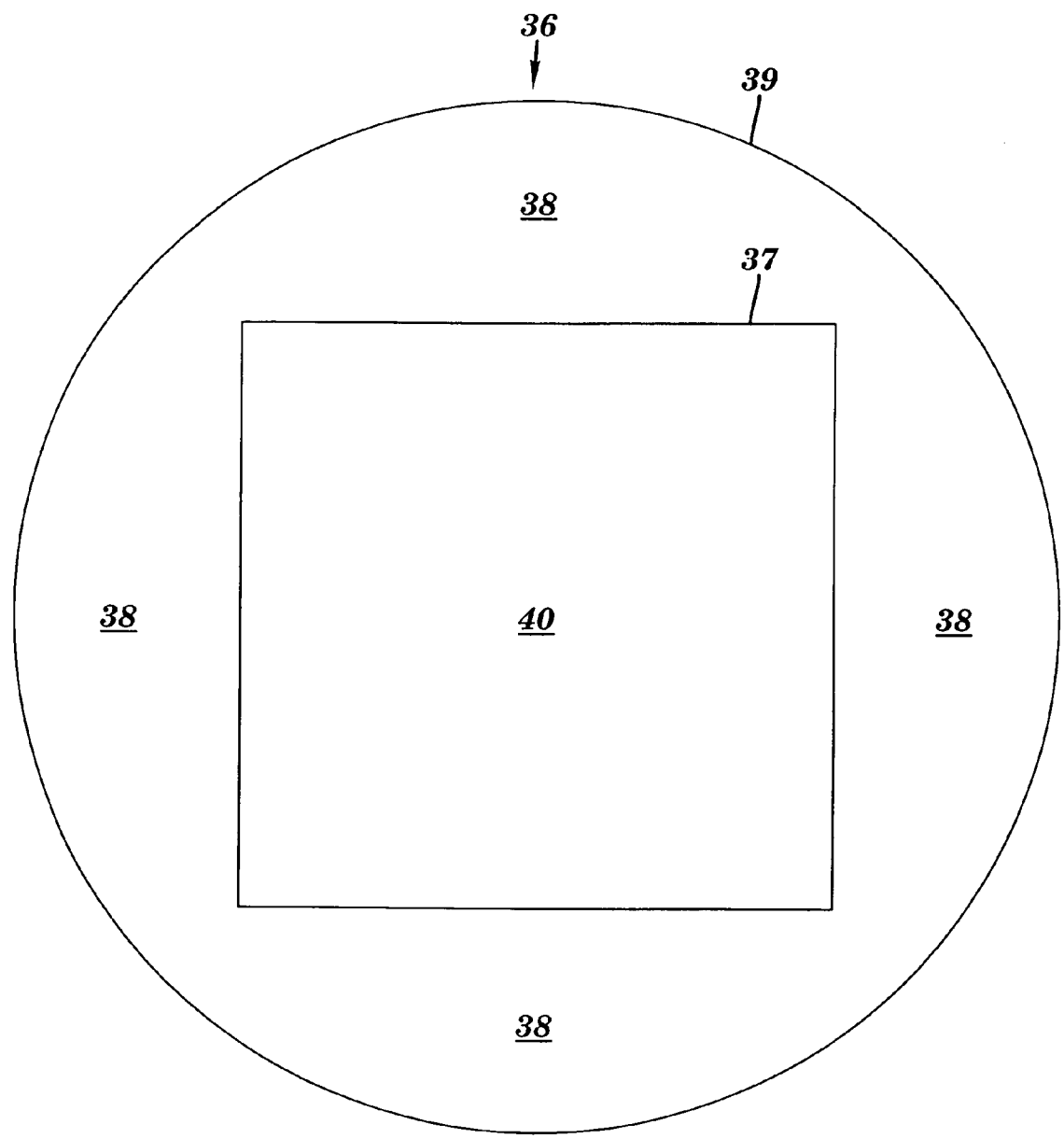
FIG. 2 depicts a top view of the wafer of FIG. 1, in accordance with embodiments of the present invention.

FIG. 2 depicts a top view of the wafer 36 of FIG. 1, in accordance with embodiments of the present invention. FIG. 2 shows that wafer 36 comprises an active portion 40 and a peripheral portion 38. The peripheral portion 38 of the wafer 36 is between the outer boundary 37 of the active portion 40 and the outer boundary 39 of the peripheral portion 38. The outer boundary 39 of the peripheral portion 38 is also the outer boundary of the wafer 36 itself. Although the outer boundary 39 of the wafer 36 is shown in FIG. 2 as having a circular shape, the outer boundary 39 may have any geometrical shape (e.g., an elliptical shape, a rectangular shape, an octagonal shape, etc.) capable of containing an active portion.

Figure 3:
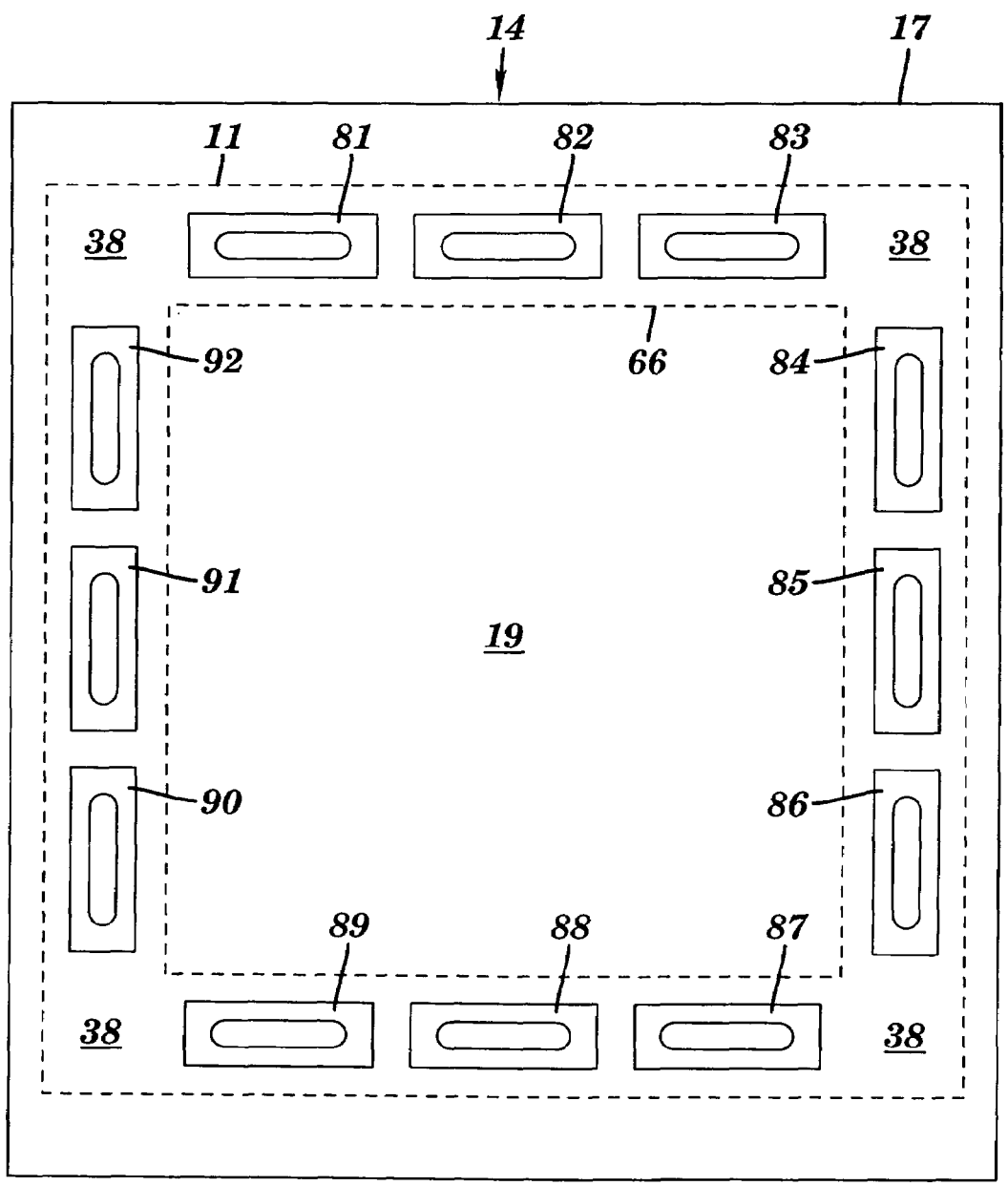
FIG. 3 depicts a top view of the reticle of FIG. 1, in accordance with embodiments of the present invention.

FIG. 3 depicts a top view of the reticle 14 of FIG. 1, in accordance with embodiments of the present invention. The reticle 14 comprises an inner area 19 (bounded by surface 66) and patterns 81-92. The inner area 19 corresponds geometrically to a device field (e.g., any of the device fields 41-49 shown in FIG. 4) of the wafer 36, so that the inner area 19 transmits the light 13 (see FIG. 1) such that the lens 16 (see FIG. 1) focuses the light 13 onto said device field. In FIG. 3, the patterns 81-92 are distributed in such a manner as to transmit the light 13 (through the lens 16 of FIG. 1) into the peripheral portion 38 (see FIG. 2) of the wafer 36. Using the reticle of FIG. 3, the present invention prints a subset of the patterns 81-92 into the peripheral portion 38 of the wafer 36 as part of the process of printing the wafer 36, in order to determine whether the reticle blind(s) 18 (see FIG. 1) are correctly positioned within the exposure apparatus 10 used for printing the wafer 36.

Figure 4:
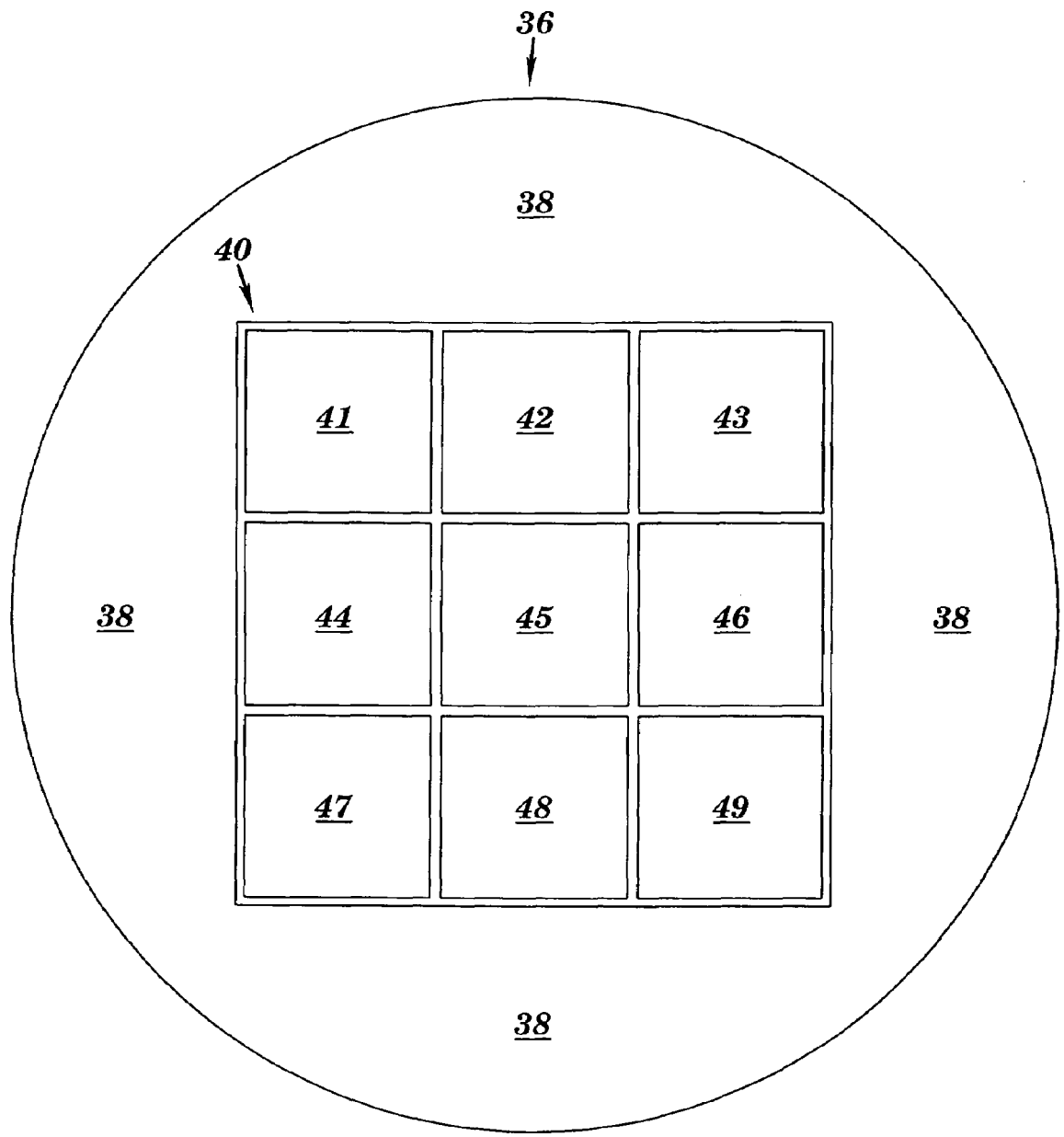
FIG. 4 depicts a top view of the wafer of FIG. 2 showing a distribution of device fields in an active area of the wafer, in accordance with embodiments of the present invention.

FIG. 4 depicts a top view of the wafer 36 of FIG. 2 showing a distribution of the device fields 41-49 in the active portion 40 of the wafer 36, in accordance with embodiments of the present invention. The device fields 41-49 each comprise an area in which one or more devices, such as semiconductor devices (e.g., integrated circuit chips) are to be printed by the exposure apparatus 10 of FIG. 1. Although FIG. 4 shows nine device fields, the wafer 36 generally includes N device fields, wherein N is a positive integer of at least 1.

Figure 5:
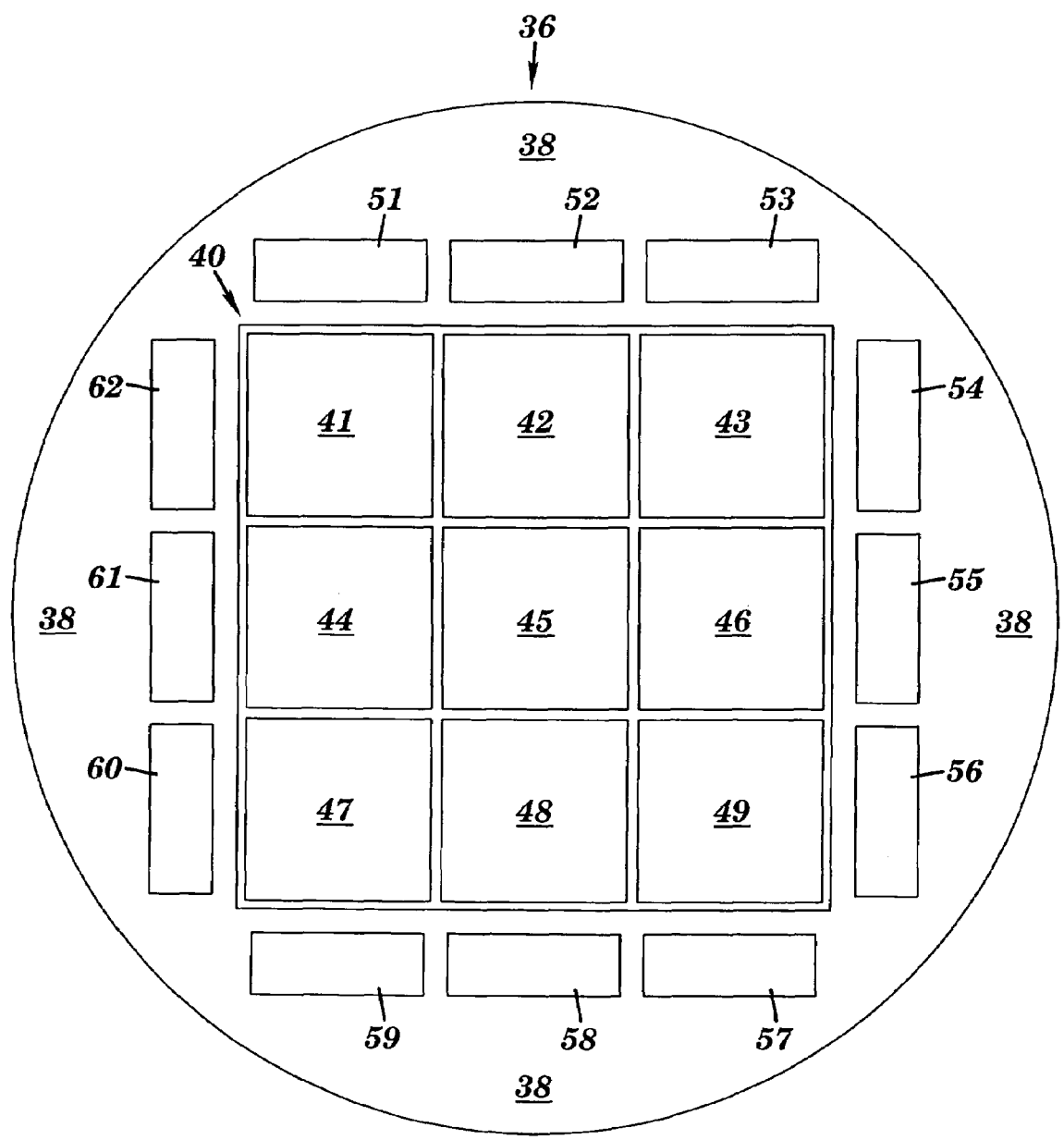
FIG. 5 depicts the wafer of FIG. 4 showing pattern fields in the peripheral portion of the wafer, in accordance with embodiments of the present invention.

FIG. 5 depicts the wafer 36 of FIG. 4 showing pattern fields 51-62 in the peripheral portion 38 of the wafer 36, in accordance with embodiments of the present invention. The pattern fields 51-62 each comprise an area in which a corresponding subset of the patterns 81-92 on the reticle 14 (see FIG. 3) is to be printed by the exposure apparatus 10 of FIG. 1 as part of the process of printing the wafer 36. For example, the pattern field 51 of FIG. 5 may correspond to the collection 81-83 of patterns on the reticle 14 of FIG. 3.

FIG. 6 depicts the wafer 36 of FIG. 5 showing upper and lower reticle blinds 64 and 65, respectively, over the wafer 36, in accordance with embodiments of the present invention. Although not shown in FIG. 6 for sake of simplicity, left and right reticle blinds are generally present. The upper and lower reticle blinds 64 and 65 move are permitted to move in (or opposite to) the direction 50, while left and right reticle blinds are permitted to move in (or opposite to) the direction 34. Definitionally, moving "downward" is moving in the direction 50, moving "upward" is moving in the direction opposite to the direction 50, moving "right" is moving in the direction 34, and moving "left" is moving in the direction that is opposite to the direction 34. The upper and lower reticle blinds 64 and 65 (as well as left and right reticle blinds if present) may collectively represent the reticle blind 18 in FIG. 1. The lower reticle blind 65 covers device fields 44-49 and each of the device fields 41-43 may be individually exposed and printed by the exposure apparatus 10 of FIG. 1, depending on the position of the left and right reticle blinds. To expose the device field 41, the right reticle blind would cover the device fields 42 and 43, and the left reticle blind would be positioned sufficiently far to the left (i.e., in the direction opposite to the direction 34) such that the device field 41 is uncovered and exposed. To expose the device field 42, the left reticle blind would cover the device field 41 and the right reticle blind would cover the device field 43 such that the device field 41 is uncovered and exposed. To expose the device field 43, the left reticle blind would cover the device fields 41 and 42, and the right reticle blind would be positioned sufficiently far to the right (i.e., in the direction 34) such that the device field 43 is uncovered and exposed. The reticle blinds serve to protect the adjacent device fields from the light 13 (see FIG. 1) while a device field is being printed by the exposure apparatus 10 of FIG. 1. For example if the device field 42 is being exposed and printed, then: the lower reticle blind 65 covers device fields 44-46 and protects the device fields 44-46 from the light 13, the left reticle blind covers the device field 41 and protects the device field 41 from the light 13, and the right reticle blind covers the device field 43 and protects the device field 43 from the light 13. Note that in order to selectively expose the device fields 41, 42, . . . , and 49, the wafer is generally moved so as to expose each device field individually.

As explained supra, while an individual device area is being printed by use of the light 13 of the exposure apparatus 10 of FIG. 1, the positioning of the reticle blinds protects the remaining portions of the active area 40 from being exposed to the light 13. Hence, it is important that the reticle blinds be correctly positioned within the exposure apparatus 10. The present invention determines whether the reticle blinds are correctly positioned, by printing the patterns 81-92 (or portions thereof) of the reticle 14 of FIG. 3 into the pattern fields 51-62 within the peripheral portion 38 of the wafer 36. For example, to determine whether the upper reticle blind 64 is correctly positioned, the upper reticle blind 64 is moved in the direction opposite to the direction 50 so as to partially cover the patterns 81-83 of the reticle 14 (see FIG. 3) and thus also partially cover each (i.e., one at a time) the pattern fields 51-53. Accordingly, the uncovered portions of patterns 81-83 of the reticle 14 are sequentially printed into the corresponding portion of each of pattern fields 51, 52, and 53. The portions of the patterns 81-83 that are covered by the upper reticle blind 64 may differ for each of pattern fields 51-53, since each of pattern fields 51-53 may be independently printed.

Independently printing each of pattern field 51-53 may be accomplished, inter alia, by printing the pattern field (51, 52, or 53) concurrent with the printing of a neighboring device field. For example, the pattern field 52 and the device field 42 may be concurrently printed, by positioning the lower reticle blind 65 and the left and right reticle blinds as described supra for exposing and printing the device field 42, and positioning the upper reticle blind 65 as shown in FIG. 6 so as to print a portion of the patterns 81-83 of the reticle 14 (see FIG. 3) into the pattern field 52. As another example, the reticle blinds could be positioned to concurrently print the device field 41, the pattern field 51, and the pattern field 62, so as to print a portion of the patterns 81-83 of the reticle 14 (see FIG. 3) into the pattern field 51, and so as to print a portion of the patterns 90-92 of the reticle 14 (see FIG. 3) into the pattern field 62. Since the reticle blinds cover only a portion of the patterns to be printed, only the uncovered portions of the patterns to be printed are actually printed in each of the pattern fields. The user of the apparatus 10 knows where the reticle blinds were positioned (or are supposed to have been positioned) and therefore also knows which portions of the patterns 81-83 should be printed into each of pattern fields 51-53. If correct portions of the patterns 81-83 are printed into each of corresponding portions of pattern fields 51-53, then the upper reticle blind 64 is correctly positioned. If incorrect portions of the patterns 81-83 are printed into any of the pattern fields 51-53, then the upper reticle blind 64 is not correctly positioned. Thus, the portions of the patterns 81-83 that are printed in each of the pattern fields 51-53 serve as a measuring device for determining whether the upper reticle blind 64 is correctly positioned. Similarly, a positioning of the lower reticle blind 65, so as to cover only a portion of the pattern fields 57-59, would facilitate a determination of whether the lower reticle blind 65 is correctly positioned within the exposure apparatus 10 of FIG. 1. Also, a positioning of the left and right reticle blinds so to cover only a portion of the pattern fields 54-56 and the pattern fields 60-62, respectively, facilitates a determination of whether said left and right reticle blinds are correctly positioned within the exposure apparatus 10 of FIG. 1.

Figure 7:
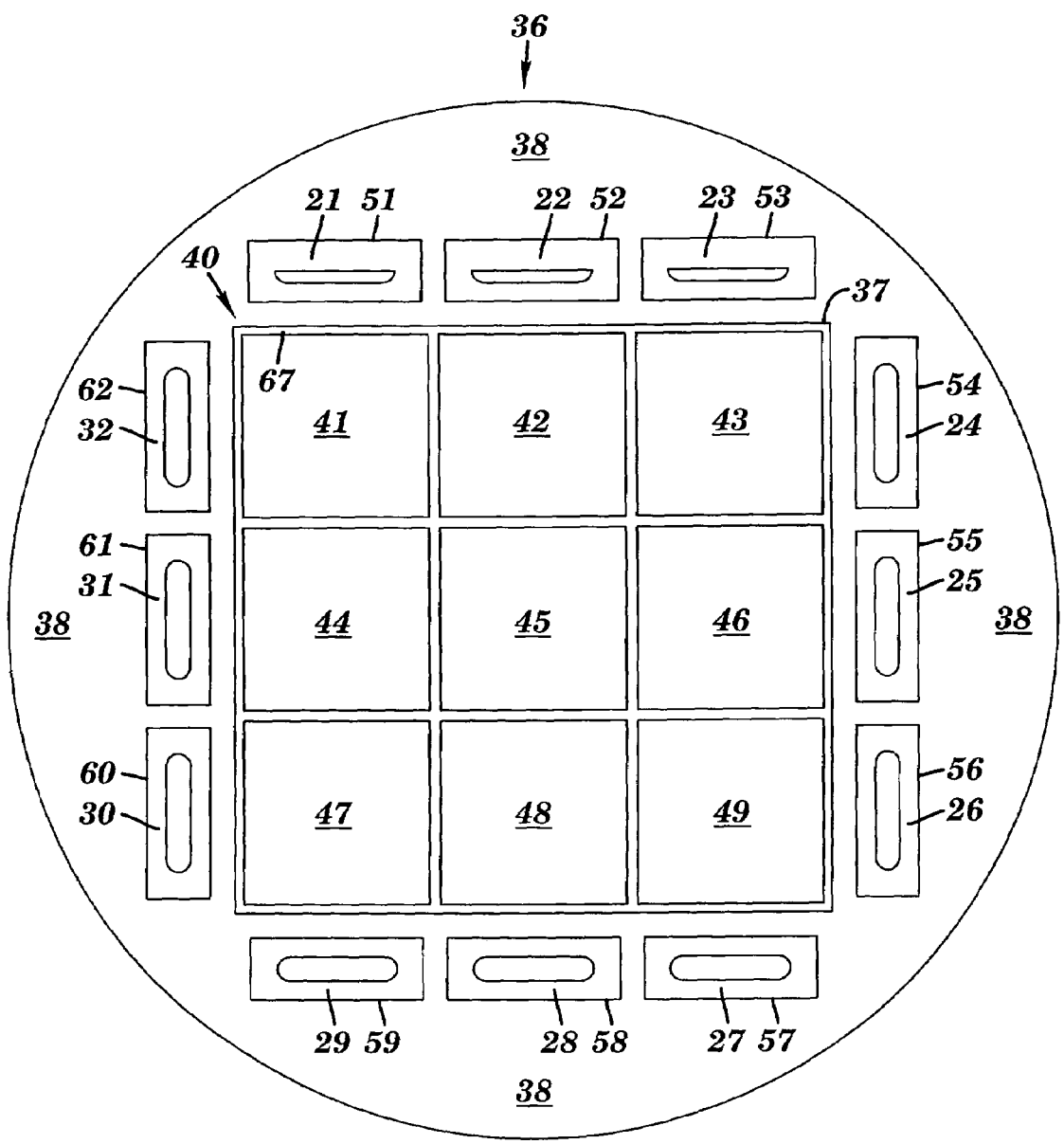
FIG. 7 depicts the wafer of FIG. 5 showing printed designs in the pattern fields, in accordance with embodiments of the present invention.

FIG. 7 depicts the wafer 36 of FIG. 5 showing printed designs 21-23 in the corresponding pattern fields 51-53, in accordance with embodiments of the present invention. The printed designs 21-23 do not have any electrical functionality. Each of the printed designs 21-23 correspond to portions of the patterns 81-83 of the reticle 14 of FIG. 3 wherein said portions of the patterns 81-83 are uncovered by the reticle blind 64 of FIG. 6. The device field 41 and the design 21 (within the pattern field 51) are each adjacent to a same portion 67 of the outer boundary 37 of the active portion 40 of the wafer 36. Similarly, the device fields 42, 43 and the designs 22, 23 (within the pattern fields 52, 53) are respectively adjacent to same portions of the outer boundary 37 of the active portion 40 of the wafer 36. As explained supra in conjunction with FIG. 6, the printed designs 21-23 serve as a measuring device for determining whether the reticle blind 64 is correctly positioned the exposure apparatus 10 of FIG. 1. The printed designs 21-23 may be visible to the naked eye of an observing individual. "Visible to the naked eye" comprises being visible to the naked eye unaided or visible to the naked eye with use of one or more vision aids such as, inter alia, a magnifying device (e.g., a microscope), eyeglasses, contact lenses, etc.

Figure 8:
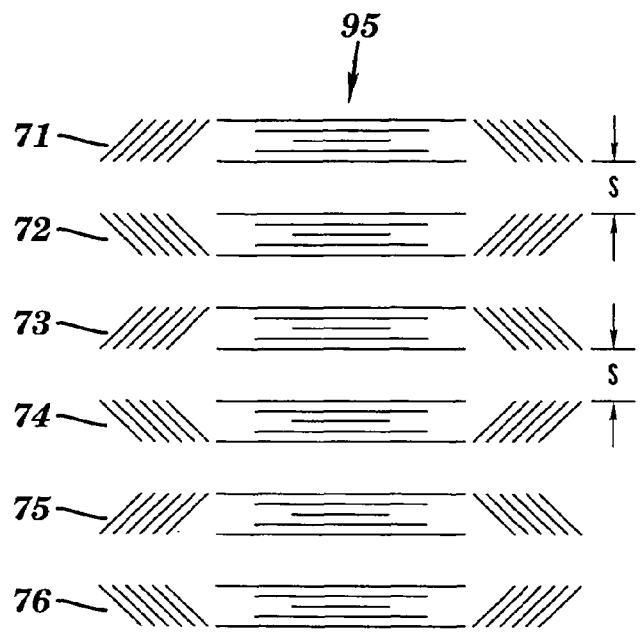
FIG. 8 depicts pattern elements of an exemplary pattern of the reticle of FIG. 3, in accordance with embodiments of the present invention.

FIG. 8 depicts pattern elements of an exemplary pattern 95 on the reticle 14 of FIG. 3, in accordance with embodiments of the present invention. The pattern 95 exemplifies any of the patterns 81-92 on the reticle 14 of FIG. 3. The pattern 95 comprises pattern elements 71-76 as shown. Adjacent pattern elements are separated by a spacing S. The spacing S is about equal to a design tolerance, wherein the design tolerance is a sum of a first design tolerance and a second design tolerance. The first design tolerance is based on how accurately a reticle blind can be positioned within the exposure apparatus 10 of FIG. 1. The second design tolerance is based on how sharply an edge of the reticle blind (e.g., the edge 63 of the reticle blind 64 of FIG. 6) can be focused on the wafer 36 by the lens 16 of the exposure apparatus 10 (see FIG. 1). Thus, the printed designs 21-23 in FIG. 7 measure, to within the design tolerance, where the upper reticle blind 64 is positioned relative to the patterns 81-83 on the reticle 14 of FIG. 3.

The particular pattern 95 shown in FIG. 8 is merely illustrative. The scope of the present invention includes any desired pattern with respect to any characteristics such as pattern elements, shape, lines, spacings, curvatures, densities (e.g., shades of gray), etc.

Figure 9:
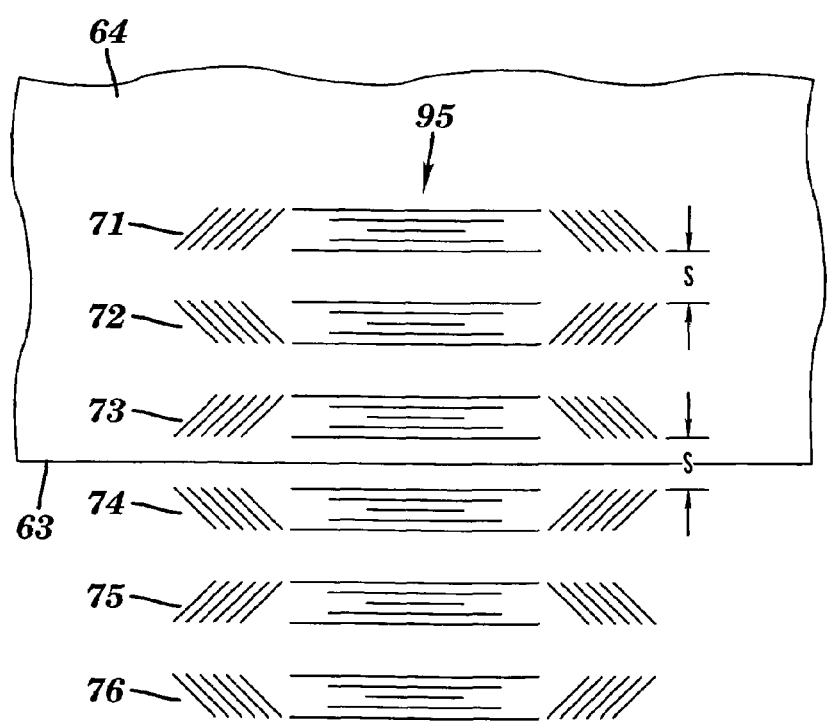
FIG. 9 depicts a reticle blind over a portion of the exemplary pattern of FIG. 8, in accordance with embodiments of the present invention.

FIG. 9 depicts the upper reticle blind 64 of FIG. 6 over a portion of the exemplary pattern 95 of FIG. 8, in accordance with embodiments of the present invention. FIG. 9 shows that the edge 63 of the upper reticle blind 64 is positioned at about a midpoint location within the spacing gap between pattern elements 73 and 74 of the exemplary pattern 95. Accordingly, pattern elements 71-73 are covered by the reticle blind 64, and pattern elements 74-76 are not covered by the upper reticle blind 64. Consequently, if the pattern 95 is aligned over the pattern field 51 in the peripheral portion 38 of the wafer 36 (see FIG. 6) with the upper reticle blind 64 positioned as shown in FIG. 9, then only the pattern elements 74-76 of the pattern 95 will be printed into the pattern field 51 and the pattern elements 71-73 of the pattern 95 will not be printed into the pattern field 51. Thus, the design 21 (see FIG. 7) encompassing the pattern elements 71-76 in the pattern field 51 serves as a measuring device for determining whether the upper reticle blind 64 is correctly positioned within the exposure apparatus 10 of FIG. 1. Note that a vernier scale could be used in conjunction with a microscope to facilitate an accurate determination of the position of the upper reticle blind 64.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An exposure apparatus for printing a wafer, comprising:
a lens;
a reticle that includes a pattern; and
a reticle blind, wherein the reticle blind is adapted to block a first portion of light that is passed through the exposure apparatus,
wherein a transparent portion of the reticle is adapted to transmit a remaining portion of the light,
wherein the lens is adapted to focus the remaining portion of the light onto the wafer such that an image of a portion of the pattern is printed as a design within a peripheral portion of the wafer,
wherein the peripheral portion of the wafer is between an outer boundary of an active portion of the wafer and an outer boundary of the wafer,
wherein the printed design is a function of where the reticle blind is positioned relative to the pattern,
wherein the pattern includes a plurality of pattern elements such that adjacent pattern elements are separated by a spacing, wherein the spacing is about equal to a design tolerance,
wherein the design tolerance is a sum of a first design tolerance and a second design tolerance,
wherein the first design tolerance is based on how accurately the reticle blind can be positioned within the exposure apparatus, and
wherein the second design tolerance is based on how sharply an edge of the reticle blind can be focused onto the wafer by the lens of the exposure apparatus.

2. The apparatus of claim 1, wherein the wafer is a semiconductor wafer, and wherein a device field within the active portion of the wafer includes at least one integrated circuit chip.

3. The apparatus of claim 1, wherein the printed design is visible to a naked eye unaided.

4. The apparatus of claim 1, wherein no portion of the printed design is within the active portion of the wafer.

5. The apparatus of claim 1, wherein the printed design measures, to within the design tolerance, where the reticle blind is positioned relative to the pattern.

6. An exposure apparatus for printing a wafer, comprising:
a lens;
a reticle that includes a pattern;
a reticle blind, wherein the reticle blind is adapted to block a first portion of light that is passed through the exposure apparatus; and
means for determining whether the reticle blind is correctly placed within the exposure apparatus,
wherein a transparent portion of the reticle is adapted to transmit a remaining portion of the light, wherein the lens is adapted to focus the remaining portion of the light onto the wafer such that an image of a portion of the pattern is printed as a design within a peripheral portion of the wafer, wherein the peripheral portion of the wafer is between an outer boundary of an active portion of the wafer and an outer boundary of the wafer, wherein the printed design is a function of where the reticle blind is positioned relative to the pattern, wherein the pattern consists of a plurality of pattern elements wherein adjacent pattern elements of the plurality of pattern elements are separated by a spacing, and wherein the spacing is about equal to a design tolerance, and wherein the design tolerance is a function of how sharply an edge of the reticle blind can be focused onto the wafer by the lens.

* * * * *

UNITED STATES PATENT AND TRADEMARK OFFICE
CERTIFICATE OF CORRECTION

PATENT NO. : 7,656,505 B2 Page 1 of 1
APPLICATION NO. : 11/326968
DATED : February 2, 2010
INVENTOR(S) : Froebel et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 902 days.

Signed and Sealed this

Thirtieth Day of November, 2010

David J. Kappos
*Director of the United States Patent and Trademark Office*